Feb. 26, 1963 R. W. AVERYT ET AL 3,079,511
CONTROLLED, REGENERATIVE FEEDBACK TRANSMISSION GATE WITH SHUNTING CAPACITOR AND INHIBITING BIAS FOR PROMPT OPERATION
Filed Dec. 31, 1958
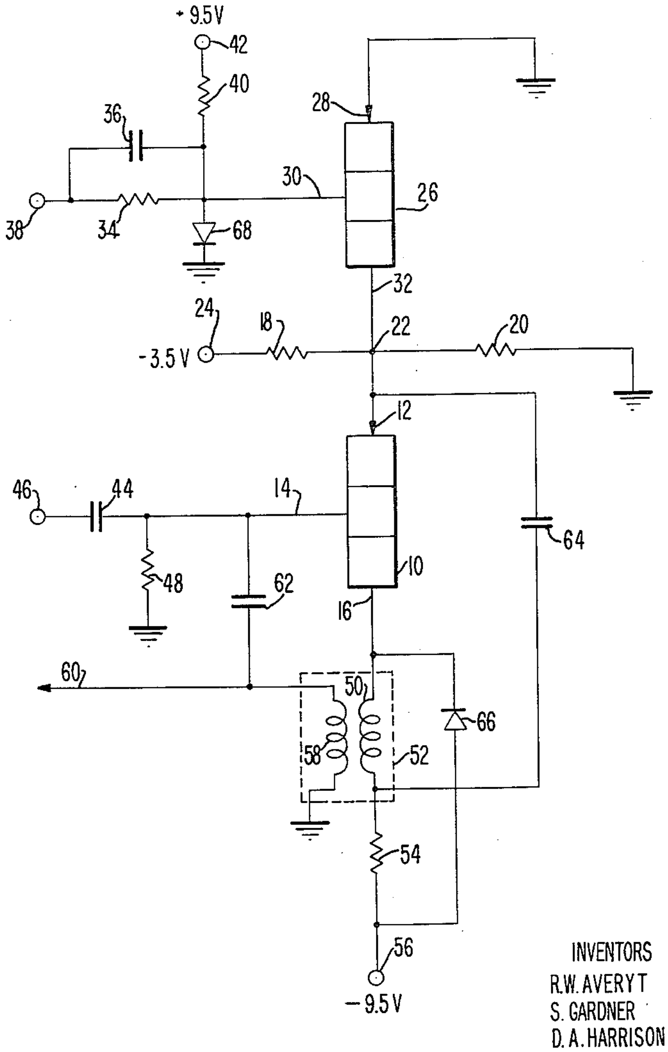
INVENTORS
R.W. AVERYT
S. GARDNER
D. A. HARRISON
BY Edgar J. Kent
ATTORNEY 3,079,511
Patented Feb. 26, 1963

3,079,511

CONTROLLED, REGENERATIVE FEEDBACK TRANSMISSION GATE WITH SHUNTING CAPACITOR AND INHIBITING BIAS FOR PROMPT OPERATION

Robert W. Averyt, Kingston, Stephen Gardner, Germantown, and Donald A. Harrison, Poughkeepsie, N.Y., assignors to International Business Machines Corporation, New York, N.Y., a corporation of New York Filed Dec. 31, 1958, Ser. No. 784,210
7 Claims. (Cl. 307—88.5)

This invention relates to pulse control circuitry and more particularly to a transistorized pulse control circuit suitable for use with high speed data processing equipment.

The demand for reliable logical circuit components has recently been accentuated due to the increasing variety of applications for digital data processing equipment and to certain contemporary design developments. Lack of suitable components capable of reliable operation at high pulse repetition frequencies has severely handicapped the performance and capabilities of such equipment. Particularly important are the pulse control circuits where the data manipulated by this type of equipment is in the form of pulses, and is controlled by pulses. For accurate operation it is imperative that pulses of proper duration and amplitude be generated and transmitted with precise coordination. Digital computers presently being developed require pulse circuits which meet these criteria and which will operate at pulse repetition frequencies in excess of five megacycles per second.

Accordingly, it is an object of this invention to provide a highly reliable pulse generating circuit capable of operating at and above the above-mentioned magnitude of pulse repetition frequencies.

Another object of the invention is to provide an improved pulse gating circuit particularly adapted for use with high speed data processing equipment.

Other objects and advantages of the invention will become apparent as the following description of a preferred embodiment of the invention progresses, in conjunction with the schematic diagram of the circuitry shown in FIGURE 1 of the drawing.

The circuit according to the preferred embodiment of the invention shown in the drawing provides a pulse amplifying and shaping circuit, responsive to input pulse signals, in combination with a gating control circuit. The gating control circuit, which includes a transistor switch, is adapted to remove an inhibiting bias voltage from the pulse amplifying circuit when the switch is closed. The pulse amplifying circuit also includes a transistor which, in conjunction with a pulse transformer and capacitor control, is adapted to generate an output pulse of desired configuration when it is turned on. The amplifier transistor is connected in grounded emitter configuration with its collector electrode connected to a pulse transformer. A shunting capacitance is connected across the output circuit of the transistor and the primary winding of the transformer and a feedback capacitance is connected between the secondary of the pulse transformer and the input circuit of the transistor. When the inhibiting bias is removed from the emitter electrode, an input pulse of proper polarity applied to the base electrode, will turn the amplifier transistor on. The resulting current flow in the output circuit of that transistor produces a pulse which is fed back regeneratively and drives the transistor rapidly into saturation. The shunt capacitor is connected to discharge through the transistor and supplies power to the output pulse. When the output pulse level returns toward ground the feedback capacitor acts to rapidly turn off the transistor, thus providing a sharp trailing edge of the pulse.

The resulting output pulse is of a desired configuration and is independent of substantial variations in the shape of the input pulse. Also the pulse amplifying circuit is extremely sensitive to the presence or absence of the conditioning level and responds rapidly to its changes. This circuitry has excellent noise discrimination characteristics, is extremely reliable and has been operated at pulse repetition frequencies in excess of eight megacycles per second.

With reference to the figure of the drawing, pulse amplification is provided by a transistor 10, which in the preferred embodiment is a PNP micro alloy diffused junction transistor, having an emitter electrode 12, a base electrode 14 and a collector electrode 16. The transistor is connected in grounded emitter configuration such that a negative going signal applied to the base electrode 14 is adapted to forward bias the emitter base junction to the transistor, permitting conduction in the transistor output circuit which comprises the emitter electrode 12 and the collector electrode 16.

The emitter 12 is normally biased negatively to a potential of approximately −1.5 volts by the voltage divider network consisting of resistors 18 and 20. The resistors are connected at their common junction 22 to the emitter electrode 12. The second terminal of resistor 18 is connected to a source of negative potential, 3.5 volts in magnitude, at terminal 24 and the second terminal of resistor 20 is connected to ground.

The biasing potential is adapted to be removed from junction 22 by means of an electronic switching device consisting of a transistor 26 connected in grounded emitter configuration. The transistor has an emitter electrode 28 which is grounded, a base electrode 30 and a collector electrode 32 which is connected to the junction 22. The base electrode 30 is connected through a parallel combination of a biasing resistor 34 and an overdrive capacitor 36 to a source of control signals at terminal 38. A negative going signal, 3.0 volts in amplitude, applied at terminal 38 is adapted to forward bias the emitter base junction of transistor 26, permitting conduction in its output circuit which raises the potential at junction 22 to ground, thus removing the negative biasing potential from the pulse amplifying circuit. The resistor 40, connected between the base electrode 30 and a source of positive potential 9.5 volts in magnitude, at terminal 42, supplies $I_{co}$ to the transistor to insure that it remains off in the absence of an input signal of proper polarity.

The base 14 of transistor 10 is connected through a capacitor 44 to a terminal 46 to which input pulses are applied. A resistor 48, connected between the base electrode 14 and ground, provides, in combination with capacitance 44, an RC circuit having a time constant of a magnitude such that the transistor is insensitive to noise signals less than one volt in amplitude. This RC circuit also provides sufficient dissipation of input signals applied to terminal 46 when junction 22 is negatively biased so that the transistor 10 is not turned on by such signals. The resistor 48 further provides a path for $I_{co}$, thus insuring the maintenance of the transistor 10 in its off condition the absence of an input pulse of proper polarity.

The collector electrode 16 of transistor 10 is connected to one terminal of the primary winding 50 of a pulse transformer 52. The second terminal of the primary winding is connected through a resistance 54 and terminal 56 to a source of negative potential, 9.5 volts in magnitude. The secondary winding 58 of the pulse transformer is connected between ground and pulse output line 60. A feedback capacitor 62 is connected between the output pulse line 60 and the base electrode 14. Another capacitor 64 is connected across the series combination of transistor 10's output circuit and the primary winding of the transformer 52.

The diode 66, connected between the source 56 and the collector electrode 16, is normally reverse biased and is provided to protect the transistor against overvoltages which might exceed its punch through level. The diode 68, connected between ground and the base electrode of transistor 26 is utilized to clamp that electrode at ground, thus insuring rapid turn on of transistor 26 upon application of a signal of proper polarity at terminal 38.

When the circuit is in quiescent condition the input terminals 38 and 46 are at zero potential and the junction 22 is at a potential of −1.5 volts. A negative going pulse 3.0 volts in magnitude and 55 millimicroseconds maximum width applied to terminal 46 will not sufficiently forward bias the emitter base junction of transistor 10 to turn that transistor on. Thus no output pulse will be generated. A negative going signal level 3.0 volts in amplitude, applied at terminal 38, however, will forward bias the emitter base junction of transistor 26 and turn that transistor on so that the junction 22 is raised from −1.5 volts to ground potential. Under that circumstance an input pulse of the character described, applied at terminal 46, will sufficiently forward bias the emitter base junction of the amplifier transistor 10, to establish conduction in its output circuit.

The amplifying circuit is very sensitive and responds quickly to the presence or absence of the conditioning level. Before the transistor 26 is turned on a potential of approximately 8 volts is impressed across capacitor 64. This potential does not change immediately after transistor 26 is turned on but the 8 volt potential on capacitor 64 effectively shifts positively such that junction 22 immediately rises to ground potential. The potential across capacitor 64 then increases exponentially toward 9.5 volts. When the conditioning level applied at terminal 38 is removed the transistor 26 is turned off and the potential at junction 22 immediately falls to about −0.6 volts, as the capacitor is floating and its potential shifts downward, impressing a voltage across resistor 54. The potential on junction 22 then continues to fall exponentially toward −1.5 volts according to the time constant determined by the capacitor 64 and the resistors 18 and 54. This circuitry enables the prompt conditioning and deconditioning of the amplifying circuit by sensitive control of the potential at junction 22 and avoids those delays which would be introduced should the conditioning level be applied and removed solely through an exponential change in voltage.

A negative going pulse of the character above described, applied at terminal 46, will turn on the transistor 10 when the amplifying circuit is appropriately conditioned as above described. The capacitive voltage divider, consisting of capacitors 44 and 62, affords a certain degree of discrimination against undesired signals such as noise as the potential at the base 14 is at an intermediate potential between the potential on line 46 and that on line 60; and therefore the signal applied to line 46 must be substantially larger than the voltage difference required to forward bias the emitter base junction of transistor 10 as only a portion of the applied potential appears at base 14. However, a 3.0 volt pulse signal, applied to the terminal 46, sufficiently lowers the potential at base 14 to forward bias the emitter base junction and current flows through the emitter collector circuit and the primary winding 50 of transformer 52. This current induces a signal in the secondary winding 58 which lowers the potential on line 60, and a signal is fed back through capacitor 62 which rapidly lowers the potential on base 14 to that of the output line 60 such that the transistor 10 is driven quickly into saturation. This feedback action causes the signal generated on line 60 to have a steep leading edge transition.

When transistor 10 is turned on, its emitter collector circuit provides a discharge path for capacitor 64 and current is supplied through the transistor output circuit and the primary winding of the output transformer. The duration of this discharge is a function of the size of capacitor 64 and the characteristics of transistor 10 and transformer 52. Without capacitor 64 in the circuit pulse current would be drawn from transistor 26 and resistors 18 and 20 only. This reduced current would result in an undesirable lower amplitude of the output signal. As the current flow in the output circuit and in the transformer primary winding is reduced toward the termination of the output pulse this reduction is reflected in the output circuit and is fed back through capacitor 62 to turn off transistor 10 rapidly. A sharp transition is thus produced on the trailing edge of the output pulse. After the transistor 10 is turned off the capacitor 64 is recharged through the series D.C. circuit towards its former potential level during the relaxation period between pulses applied to terminal 46 and thus is returned to suitable condition in anticipation of the next pulse.

The values of the components which may be utilized in the gating circuitry of the preferred embodiment are as follows:

| | |
|---|---|
| Resistor **18** | 330 ohms. |
| Resistor **20** | 180 ohms. |
| Resistor **34** | 1,800 ohms. |
| Resistor **40** | 27,000 ohms. |
| Resistor **48** | 120 ohms. |
| Resistor **54** | 100 ohms. |
| Capacitor **36** | 33 micro-microfarads. |
| Capacitor **44** | 100 micro-microfarads. |
| Capacitor **62** | 82 micro-microfarads. |
| Capacitor **64** | 470 micro-microfarads. |
| Transistor **10** | MADT. |
| Transistor **26** | MADT. |
| Diode **66** | T6G. |
| Diode **68** | T6G. |
| Transformer **52** | 2.3/1 step down ratio. |

The circuit according to the invention provides an output pulse of constant amplitude and width independent of substantial variations in the input pulse. In the preferred embodiment the circuit generates a pulse over the range of pulse repetition frequencies of from 0 to 8.35 megacycles which has a constant amplitude of −3.0 volts where the pulse input varies between −2.5 volts and −4.5 volts, and a width of 40 millimicroseconds where the width of the input varies between 35 and 50 millimicroseconds. The amplifying circuit is substantially insensitive to noise and the delay introduced by the circuit is less than 16 millimicroseconds. Further, the circuit is capable of driving four 120 ohm transmission lines in parallel.

This circuitry may be combined with a variety of gate conditioning means and is very sensitive to the levels applied by such means. In the preferred embodiment the conditioning circuit is a true D.C. level inverter rather than merely an impedance changer. The entire circuitry provides a reliable high speed pulse amplifying and gating circuit with wide operating tolerances and it has a variety of applications, the advantages being particularly significant in digital computer circuitry applications.

While a preferred embodiment of the invention has been shown and described, it will be understood that the invention is not limited thereto or to details thereof and departures may be made therefrom within the spirit and scope of the invention as defined in the following claims.

We claim:

1. A pulse generating circuit comprising a transistor having an input circuit and an output circuit, a load impedance and a source of potential connected in series with said output circuit, an output line connected to said load impedance, a capacitor connected across the series combination of said output circuit and said load impedance,
said capacitor being adapted to be charged by said source of potential,
means to apply a pulse signal to said input circuit,
said pulse signal being adapted to produce a state of conduction in said output circuit effective to discharge said capacitor through said output circuit,
thereby supplying current through said output circuit to said load impedance and producing an output pulse on the said output line having a duration independent of substantial variation in the duration of said input pulse signal,
means for applying a biasing potential to said input circuit including a resistive voltage divider circuit connected to one terminal of said capacitor and a resistor connected between the other terminal of said capacitor and said source of potential whereby the potential level of said capacitor is permitted to float and is responsive to changes in said biasing potential,
said biasing potential being adapted to prevent said pulse signal from placing said output circuit in a state of conduction,
and means to remove said biasing potential.

2. A pulse generating circuit comprising a first transistor having input, output and common electrode elements,
a load impedance having at least two terminals,
a first load impedance terminal connected to said output electrode element,
a source of potential connected to a second load impedance terminal,
an output line connected to said load impedance,
a capacitor having two terminals,
one terminal of said capacitor being connected to said common electrode element and the other terminal of said capacitor being connected to said second load impedance terminal,
said capacitor being adapted to be charged by said source of potential,
a second transistor having input, output and common electrode elements,
the output electrode element of said second transistor being connected to the common electrode element of said first transistor to form a junction therebetween,
means for applying a biasing potential to said junction including a resistive voltage divider circuit connected to one terminal of said capacitor at said junction and a resistance connected between the other terminal of said capacitor and said source of potential whereby the potential level of said capacitor is permitted to float and is responsive to changes in said biasing potential,
means to apply a conditioning signal to the input electrode element of said second transistor to remove said biasing potential from said junction,
and means to apply a pulse signal to said input electrode element of said first transistor,
said pulse signal being adapted to change the state of conduction of said first transistor when said biasing potential is removed from said junction effective to discharge said capacitor through the output electrode element of said first transistor,
thereby supplying a current to said load impedance and producing an output pulse on said output line having a duration independent of substantial variation in the duration of said input pulse signal.

3. The pulse generating circuit as claimed in claim 1 wherein said transistor has an emitter, a base, and a collector and the emitter is the common electrode so that the input circuit includes the emitter and base and the output circuit includes the emitter and collector, said load impedance is a pulse transformer having a primary winding and a secondary winding, said primary winding having one terminal connected to said collector and the other terminal connected to a source of potential, and said pulse signal applying means is adapted to apply an input signal pulse to said base so as to render said transsistor conductive and produce an output pulse across said secondary winding, said output pulse having the same polarity as the input pulse.

4. A high speed pulse gating circuit comprising a PNP type transistor having an emitter, a base and a collector, a transformer having a primary winding and a secondary winding, said primary winding having one terminal connected to said collector and the other terminal connected to a negative potential, means for applying a negative signal pulse to said base adapted to turn said transistor on, means for applying a negative biasing potential to said emitter adapted to reverse bias the emitter base junction of said transistor to prevent the turn on of said transistor in response to said input pulse and means responsive to a gate conditioning signal for removing said biasing potential, a capacitor shunting the emitter and collector of said transistor and said primary winding and connected between said emitter and said negative potential, said capacitor being adapted to be charged by said potential and to be discharged when said transistor is turned on thereby supplying current to said primary winding and producing an output pulse across said secondary winding, said output pulse having the same polarity as said input pulse.

5. The pulse generating circuit as claimed in claim 4 and further including an input signal coupling capacitor connected to said base and a feedback capacitor connected between said secondary winding and said base, said coupling and feedback capacitors being arranged in cooperating relationship to provide voltage divider action whereby said transistor is rendered insensitive to noise signals of a significant magnitude.

6. The pulse generating circuit as claimed in claim 4 wherein said means to remove said biasing potential comprises a second transistor having an input circuit and an output circuit, said output circuit being connected to the emitter of said first transistor, forming a junction therebetween to which said biasing potential is applied, and means to apply said conditioning signal to the input circuit of said second transistor, said signal being adapted to turn said second transistor on thereby producing conduction in its output circuit effective to remove the biasing potential from said junction.

7. The pulse generating circuit as claimed in claim 6 wherein said biasing means includes a resistive voltage divider circuit connected to one terminal of said shunt capacitor, and further including a resistor connected between the other terminal of said shunt capacitor and said negative potential whereby the potential level of said shunt capacitor is permitted to float and is responsive to changes in said biasing potential as applied to said emitter.

References Cited in the file of this patent

UNITED STATES PATENTS

| | | |
|---|---|---|
| 2,663,800 | Herzog | Dec. 22, 1953 |
| 2,810,080 | Trousdale | Oct. 15, 1957 |
| 2,831,987 | Jones | Apr. 22, 1958 |
| 2,892,188 | Durbin | June 23, 1959 |
| 2,900,533 | Howes | Aug. 18, 1959 |
| 2,950,343 | Goodrich | Aug. 23, 1960 |
| 2,958,017 | Hogue | Oct. 25, 1960 |
| 3,020,419 | Brightman | Feb. 6, 1962 |

OTHER REFERENCES

Cavalieri: "What's Inside Transac," July 15, 1956, vol. 4, No. 14, pages 30–33 of Electronics Design FIG. 2.